(12) United States Patent
Pursel

(10) Patent No.: US 6,452,409 B1
(45) Date of Patent: Sep. 17, 2002

(54) MECHANISM THAT HOLDS DOWN PACKAGES

(75) Inventor: John W. Pursel, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 119 days.

(21) Appl. No.: 09/589,099

(22) Filed: Jun. 8, 2000

(51) Int. Cl.[7] ............................................. G01R 31/02
(52) U.S. Cl. ................................. 324/755; 324/158.1
(58) Field of Search ............................... 324/755, 754, 324/765, 158.1; 269/93, 94, 226, 229, 235; 72/442, 450, 452.4, 481.6

(56) References Cited

U.S. PATENT DOCUMENTS

| | | | | |
|---|---|---|---|---|
| 4,432,538 A | * | 2/1984 | Sequin | 269/92 |
| 4,500,081 A | * | 2/1985 | Carossino | 269/100 |
| 4,590,788 A | * | 5/1986 | Wallis | 269/224 |
| 5,516,087 A | * | 5/1996 | Schmid et al. | 269/226 |
| 6,032,356 A | | 3/2000 | Eldridge et al. | |
| 6,111,420 A | * | 8/2000 | Kelley et al. | 324/158.1 |

* cited by examiner

*Primary Examiner*—Michael Sherry
*Assistant Examiner*—Minh N. Tang

(57) ABSTRACT

An arrangement and method for pressing down a semiconductor package arrangement with a controlled down-force balances a pressure bar on a fulcrum. The pressure bar is biased by a spring in a first direction downwardly towards a semiconductor package to be held. An adjustment device limits the amount of rotation of the pressure bar around the fulcrum. An adjustment device controls moves the limit of rotation of the pressure bar around the fulcrum so that the pressure applied by the spring and pressure bar against the semiconductor package may be precisely controlled. This controlling of the pressure applied against the semiconductor package allows for a consistency of testing during the electrical characterization testing of the semiconductor package and eliminates the manual holding down of the package during testing.

13 Claims, 3 Drawing Sheets

US 6,452,409 B1

MECHANISM THAT HOLDS DOWN PACKAGES

FIELD OF THE INVENTION

The present invention relates to the field of testing of semiconductor packages, and more particularly, to the holding down of a semiconductor package during testing.

DESCRIPTION OF RELATED ART

Electrical components utilizing integrated circuit chips are used in a number of applications. Controlled Collapsed Chip Connection is an interconnect technology developed as an alternative to wire bonding. This technology is generally known as C4 technology, or flip-chip packaging. Broadly stated, one or more integrated circuit chips are mounted above a single or multiple layer substrate and pads on the chips are electrically connected to corresponding pads on a substrate by plurality of electrical connections, such as solder bumps. The integrated circuit chips may be assembled in an array such as a 10×10 array. The substrate is then electrically connected to another electronic device such as a circuit board with a total package being used in an electronic device such as a computer.

It is desirable to perform an electrical characterization of an integrated circuit by measuring inductance (L), capacitance (C), and resistance (R) at electrical contacts of the integrated circuit. Semiconductor dice, or chips, are typically individually packaged for use in plastic or ceramic packages. This is sometimes referred to as the first level of packaging. The packages required to support, protect, and dissipate heat from the die and to provide a lead system for power and signal distribution to the die. The package is also useful for performing burn-in and functionality testing of the die.

One of the concerns regarding the electrical characterization is the establishment and maintaining of proper contact of the package to a test card through which electrical signals are provided to exercise the package. The measurements of the electrical characteristics of the package will often change if the pressure of the package against the test card changes. Hence, during a single test of a semiconductor package, the electrical characterization may be inaccurate due to changes in pressure of the package against the test card. Furthermore, it is important to provide consistent pressure when comparing the electrical characterization of different semiconductor packages.

During testing, the semiconductor package must normally be held down manually by a test operator during the electrical characterization test. This creates a number of problems, such as inconsistent pressure applied from test to test, fatiguing of the tester who must manually apply pressure against a package, inconsistency of the pressure applied by different human test operators, and mishandling of the package by the human test operators of the package that can result in damage or mismeasurement of the electrical characterization of a package.

SUMMARY OF THE INVENTION

There is a need for an arrangement and method that will provide consistent controlled pressure against the package during testing of the package, thereby eliminating the need for a human to hold down a package during testing and the attendant disadvantages of manual holding down of the package during testing.

These and other needs are met by embodiments of the present invention which provide a mechanism for pressing down a semiconductor package arrangement with a controlled down force. The mechanism comprises a fulcrum and a pressure bar balance mounted on the fulcrum. A biasing device is arranged to bias a first end of the pressure bar in a first direction around the fulcrum. An adjustment device of the mechanism is arranged to limit movement of the pressure bar in the first direction and control the pressure applied against a semiconductor package arrangement by the first end of the pressure bar.

One of the advantages of the mechanism of the present invention is the biasing of the pressure bar around the fulcrum that produces a down force pressure against a semiconductor package arrangement. At the same time, however, the down force provided by the biasing device is limited so that the pressure applied against the semiconductor package arrangement is controlled. Also, since the pressure bar is biased, the first end of the pressure bar may be left against the semiconductor package arrangement in a stable position, relieving a human tester from manually pressing the semiconductor package against a test card.

The earlier stated needs are also met by another embodiment of the present invention which provides a method of testing an integrated circuit package comprising the steps of positioning an integrated circuit package on a test surface and applying a controlled pressure with a pressure bar against the integrated circuit package to hold the integrated circuit package against the test surface. Testing of the integrated circuit package is performed while the controlled pressure is applied against the integrated circuit package by the pressure bar.

Although the present invention has been described and illustrated in detail, it is to be clearly understood that the same is by way of illustration and example only and is not to be taken by way of limitation, the scope of the present invention being limited only by the terms of the appended claims.

DETAILED DESCRIPTION OF THE INVENTION

The present invention addresses problems related to the holding down of semiconductor packages during electrical characterization of these packages. These problems include that of applying inconsistent pressure against the semiconductor package, making the measurements of the electrical characteristics of the package unreliable. These and other problems are solved, in part, by the present invention which provides a mechanism for pressing down a semiconductor package arrangement with controlled down force. Under certain embodiments of the invention, a pressure bar is balanced on a fulcrum and biased around the fulcrum on the first direction by a biasing device, such as a spring, to press the contact end of the pressure bar against a semiconductor package. The amount of down force and pressure applied by the contact end of the pressure bar is limited by an adjustment device, such as an adjustment screw provided at the other end of the pressure bar. The use of a meter allows a precise measurement of the pressure applied against the semiconductor package, or in other embodiments, the height of the screw adjustment allows a consistent pressure to be applied from package to package. Since the pressure bar is biased against the semiconductor package, a human test does not need to manually hold the semiconductor package during testing.

Figure 1:
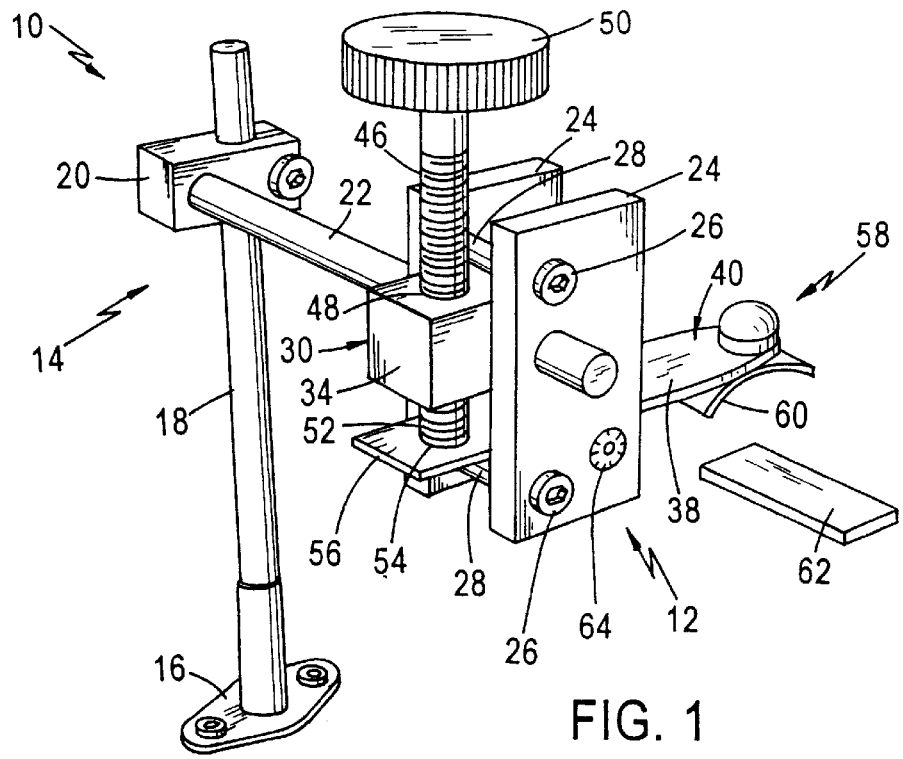
FIG. 1 is a perspective view of a mechanism for pressing down a semiconductor package arrangement with a controlled down force in a non-contact position, constructed in accordance with an embodiment the present invention.

FIG. 1 is a perspective view of a mechanism constructed in accordance with embodiments of the present invention for pressing down and holding a semiconductor package arrangement with a controlled down force. Mechanism 10 includes a pressure adjustment housing 12 that is mounted on an articulated support 14. The pressure adjustment housing 12 may be moved upwardly and rotated around a base 16 of the articulated support 14. A vertical pole 18 is rotatably mounted to the base 16. The articulated support 14 also includes a horizontal support bar 22 attached to a vertical adjustment clamp 20 that is clamped to the vertical pole 18. The rotational position of the pressure adjustment housing 12 is adjusted by rotating the vertical pole 18 within the base 16. The height of the pressure adjustment housing 12 with respect to the base 16 is adjusted by movement of the vertical adjustment clamp 20 on the vertical pole 18.

The pressure adjustment housing 12 comprises a pair of sidewalls 24 held together by a pair of bolts 26. Sidewalls 24 are separated by sleeves 28 fitted over the bolts 26 and provided beside the two sidewalls 24. As will be more apparent later, the bottom bolt 26 and sleeve 28 form between a fulcrum post around which a pressure bar is turned.

Figure 4:
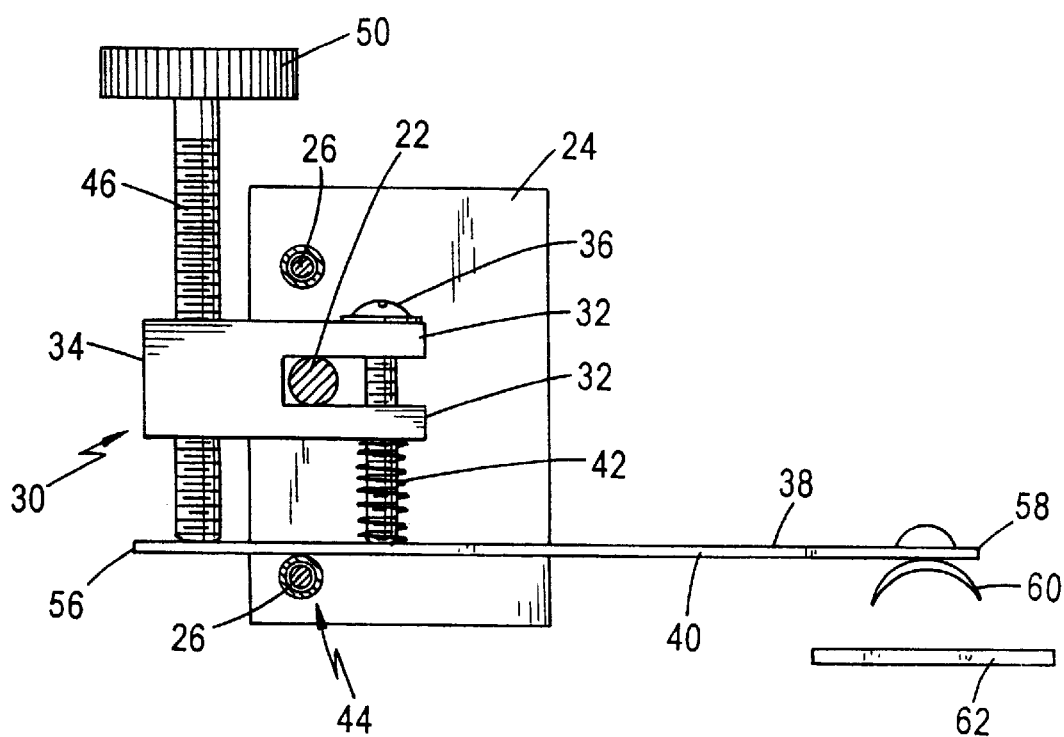
FIG. 4 is a cross-section of a portion of the adjustment mechanism when the pressure bar is in the non-contact position.

Pressure adjustment housing 12 also includes a horizontal support rod clamp 30 that is secured on the horizontal support rod 22. As depicted more clearly in the cross-section of FIG. 4, the horizontal support rod clamp 30 has extending portions 32 and a connection portion 34 from which the extending portions 32 extend. A screw 36 extends through the extending portions 32 of the horizontal support rod clamp 30 and serves to clamp the horizontal support rod clamp 30 to the horizontal support rod 22. By loosening this screw 36, the position of the pressure adjustment housing 12 along the horizontal support rod 22 may be changed and fixed by re-tightening the screw 36.

A biasing device is positioned between the bottom extending portion 32 of the horizontal support rod clamp 30 and the top surface 38 of a pressure bar 40. In the exemplary illustrated embodiment, the biasing device is a compression spring 42 held in place by the screw 36. The spring 42 biases the pressure bar 40 in a downward direction around the fulcrum formed by bottom bolt 26 and sleeve 28. Hereinafter, the bottom bolt 26 and sleeve 28 will be referred to as the fulcrum 44.

An adjustment device is arranged to limit movement of the pressure bar 40 in the first, downward direction and control the pressure applied against a semiconductor package arrangement by the pressure bar 40. The adjustment device, in the exemplary illustrated embodiments, includes an adjustment screw 46 that is screwably received in a bore 48 in the connection portion 34 of the horizontal support rod clamp 30. An adjustment screw knob 50 provides an easy control surface for an operator to adjust the height of the top surface 38 of the pressure bar 40 at a second end 56 of the pressure bar 40. In certain embodiments, the end 52 of the adjustment screw 46 is received within an adjustment screw receive hole 54 in the pressure bar 40.

At the first end 58 of the pressure bar 40, a contact piece 60 is attached. The contact piece 60 is configured to adapt to variously angled or sized pieces and provide a firm contact of the mechanism 10 with the semiconductor package or other workpiece.

Figure 3:
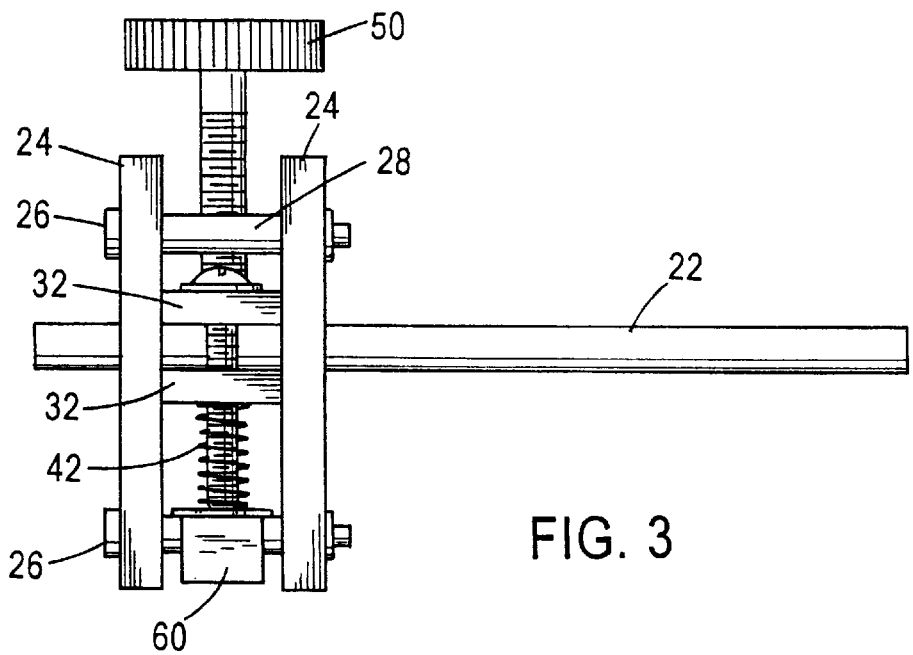
FIG. 3 is a front view of a pressure adjustment housing of the mechanism of FIG. 1, constructed in accordance with embodiments of the present invention.

The position of the pressure bar 40 in a non-contact position is depicted in FIGS. 1 and 3. As can be appreciated, the adjustment screw knob 50 has been rotated to change the position of the adjustment screw 46 within the bore 48. This causes the end of the adjustment screw 46 to extend further below the connecting portion 34. The end 52 of the adjustment screw 46 forces the second end 56 of the pressure bar 40 in a downward direction, against the biasing force of the spring 42. Hence, the pressure bar 40 is rotated in a counter-clockwise direction in FIG. 4.

Figure 2:
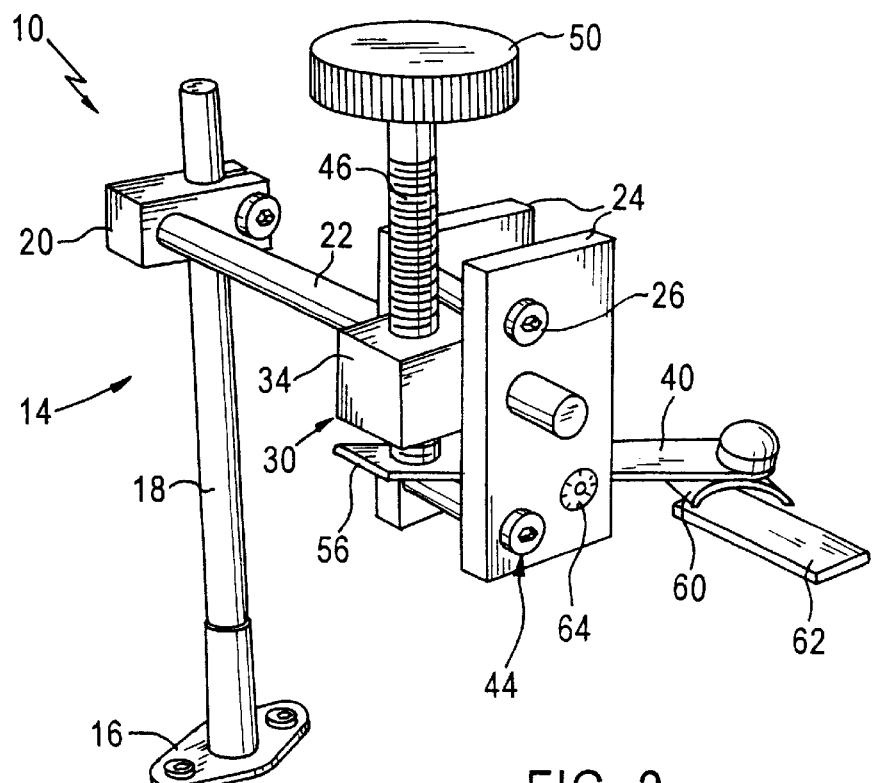
FIG. 2 depicts the mechanism of FIG. 1, in which the mechanism is in a contact position with a semiconductor package.
Figure 5:
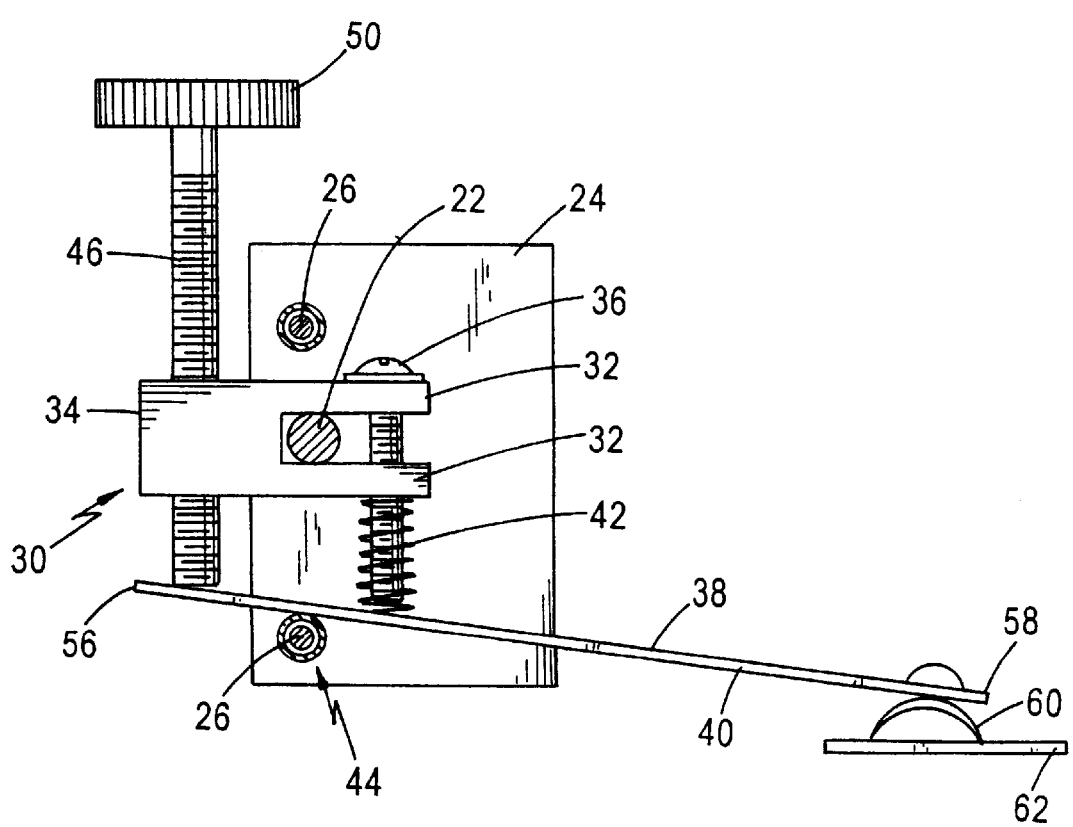
FIG. 5 depicts the cross-section of FIG. 4 when the pressure bar is in a contact position.

In order to provide a controlled down force against the semiconductor package 62, the adjustment screw knob 50 is turned in a counter-direction to move the adjustment screw 46 upwardly through the bore 48. As seen in FIGS. 2 and 5, this allows the spring 42 to rotate the pressure bar 40 in a clockwise direction (as seen in FIG. 5) around the fulcrum 44. The contact piece 60 comes into contact with the semiconductor package arrangement 62, which has previously been placed on a test card, for example.

The amount of pressure applied to the semiconductor package arrangement 62 may be provided by a meter 64. Alternatively, the pressure may be measured in a relative manner by the amount the adjustment screw 46 extends below the connecting portion 34. The greater the extension of the adjustment screw 46, the lesser the amount of pressure that will be applied by the pressure bar 40 at the first end 58. By measuring the amount of pressure applied at the first end 58 and calibrating the length of the adjustment screw 46 below the connecting Portion 34, control of the pressure may be readily accomplished by merely adjusting the adjustment screw 46 to the desired length below the connecting portion 34.

Once the semiconductor device package arrangement 62 is held with the desired amount of controlled pressure, the human test operator may initiate testing of the electrical characterization of the semiconductor package arrangement 62, without manually holding down the package 62. Consequently, the pressure applied against the package 62 throughout an individual characterization test of a package 62 will remain constant. Upon completion of the test, and during the testing of another package 62, the same control settings may be used to provide the same amount of pressure against the new package 62 to be tested. This provides consistency in applied pressure from Package 62 to package 62 during testing procedures. It also eliminates the differences in pressure applied by different humans in manually holding down the package during testing.

As the present invention provides a consistent, reproducible and controlled pressure against a semiconductor package to be tested for electrical characterization, consistency in test results is improved. Furthermore, the tester's efficiency is improved since the tester no longer needs to manually apply pressure against the package throughout the testing procedure.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. An arrangement for pressing down a semiconductor package arrangement with a controlled down force, comprising:
   a fulcrum;
   a pressure bar balance mounted on the fulcrum;
   a biasing device arranged to bias a first end of the pressure bar in a first direction around the fulcrum; and
   an adjustment device arranged to limit movement of the pressure bar in the first direction and control a pressure applied against the semiconductor package arrangement by the first end of the pressure bar.

2. The arrangement of claim 1, further comprising a pressure adjustment housing have sidewalls with the fulcrum extending between the sidewalls.

3. The arrangement of claim 2, wherein the pressure bar extends between the sidewalls and through the pressure adjustment housing, a bottom surface of the pressure bar resting on the fulcrum, the pressure bar terminating at a second end.

4. The arrangement of claim 3, wherein the adjustment device includes an adjustment screw that bears against a top surface of the pressure bar at the second end of the pressure bar, the position of the adjustment screw with respect to the pressure adjustment housing being adjustable by a screwing action to counter the biasing of the pressure bar by the biasing device.

5. The arrangement of claim 4, wherein the biasing device comprises a spring coupled at a first end to the pressure adjustment housing and bears against the top surface of the pressure bar.

6. The arrangement of claim 5, wherein the spring is a compression spring arranged to bear against the top surface of the pressure bar at a location between the fulcrum and the first end of the pressure bar.

7. The arrangement of claim 6, further comprising a vertical adjustment device coupled to the pressure adjustment housing that adjusts the vertical position of the pressure adjustment housing.

8. The arrangement of claim 7, wherein the vertical adjustment device includes a horizontal support rod extending through the pressure adjustment housing.

9. The arrangement of claim 8, wherein the pressure adjustment housing includes a horizontal support rod clamp having extending portions that extend around the horizontal support rod, and a screw through the extending portions.

10. The arrangement of claim 9, wherein the spring is mounted on the screw between one of the extending portions and the top surface of the pressure bar.

11. The arrangement of claim 10, wherein the horizontal support rod clamp includes a connecting portion to which the extending portions are connected, the connecting portion including a screw bore through which the adjustment screw extends and is screwably held in an adjustable position.

12. The arrangement of claim 11, further comprising a base, a vertical rod extending from the base, and a vertical adjustment clamp attached to the vertical rod, wherein the horizontal support rod is attached to the vertical adjustment clamp and the vertical adjustment clamp is moveable along the vertical rod to vertically adjust the horizontal support rod.

13. The arrangement of claim 12, wherein the vertical rod is rotatably mounted to the base.

\* \* \* \* \*